United States Patent [19]
Staron

[11] Patent Number: 6,021,185
[45] Date of Patent: *Feb. 1, 2000

[54] METHOD AND APPARATUS FOR PROCESSING AND DISPLAYING VIDEOTEXT OR TELEPHONE DATA

[75] Inventor: Alain Staron, Paris, France

[73] Assignee: Thomson Consumer Electronics S.A., Coubervoie, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/842,600

[22] Filed: Apr. 16, 1997

Related U.S. Application Data

[63] Continuation of application No. 08/312,577, Sep. 27, 1994, abandoned.

[30] Foreign Application Priority Data

Sep. 28, 1993 [FR] France ................................. 9311502

[51] Int. Cl.$^7$ .................................................. H04M 11/00
[52] U.S. Cl. ................. 379/93.17; 348/734; 379/110.01
[58] Field of Search ........................... 379/93.17, 102.01, 379/102.03, 102.07, 110.01, 90.01, 56, 58, 59; 455/3.1, 4.1, 5.1, 6.1, 6.3, 4.2, 420; 348/734, 906

[56] References Cited

U.S. PATENT DOCUMENTS

| | | | |
|---|---|---|---|
| 5,036,394 | 7/1991 | Morii et al. ............................. | 348/468 |
| 5,138,649 | 8/1992 | Krisbergh et al. ........................ | 379/58 |
| 5,260,989 | 11/1993 | Jenness et al. ............................ | 379/59 |
| 5,343,239 | 8/1994 | Lappington et al. ..................... | 455/5.1 |
| 5,404,393 | 4/1995 | Remillard ................................. | 379/96 |
| 5,406,558 | 4/1995 | Rovira et al. ............................ | 348/734 |
| 5,410,326 | 4/1995 | Goldstein .................................... | 348/7 |
| 5,465,401 | 11/1995 | Thompson ................................ | 379/58 |
| 5,532,754 | 7/1996 | Young et al. ............................ | 348/906 |

FOREIGN PATENT DOCUMENTS 2 188 458   9/1987   United Kingdom .

Primary Examiner—Stella Woo
Attorney, Agent, or Firm—Joseph S. Tripoli; Peter M. Emanuel; Paul P. Kiel

[57] ABSTRACT

Videotext data or data transmitted through a telephone network is displayed by: receiving and decoding the data by a receiver/decoder device disposed in a television receiver, a video cassette recorder, or connected to the television receiver or the video cassette recorder; transmitting the data from the television receiver or the video cassette recorder to a control device for the television receiver or the video cassette recorder; and, receiving and displaying the data on a display device of the control device. The data may be displayed on a tactile sensitive screen of the control device, for example liquid crystal or plasma displays. The television receiver or the video cassette recorder may be programmed responsive to tactile stimulation of the screen.

6 Claims, 1 Drawing Sheet

METHOD AND APPARATUS FOR PROCESSING AND DISPLAYING VIDEOTEXT OR TELEPHONE DATA

This is a continuation of application Ser. No. 08/312,577, filed Sep. 27, 1994, now abandoned.

BACKGROUND OF THE INVENTION

This invention concerns a process for the display of videotext or telephone data and an improvement to this process in order to control programs received by a television set, using these displayed data. This invention also concerns a device for implementation of this process and its improvement.

The teletext service and its equivalents outside Europe are capable of displaying videotext pages on a television screen, namely a set of lines of alphanumeric characters, usually in color, giving a wide variety of miscellaneous information, such as for example news, weather forecasts and television programs. Videotext signals are transmitted on the various channels at the same time as video and audio signals. A number of pages can be displayed and information; contained in them is regularly updated. An example of videotext and its specifications is described in the C.C.E.T.T. (Television and Telecommunications Common Studies Center) "Videotext display and coding specifications" published by D.A.I.I. (Industrial and International Affairs Directorate).

At the present time there are several methods of displaying videotext pages, either on the full screen, or inset in the picture of the current program, which is then partly masked. Moreover with this service, although the television viewer has a large amount of information, the information can only be read by the viewer.

SUMMARY OF THE INVENTION

This invention makes it easier for the television viewer to use videotext by allowing him to see televised pictures and videotext pages, without having them interfere with each other.

The process according to the invention displays information contained in videotext pages without the need to be in front of the television set, thus eliminating all distance constraints for reading this information existing in previous systems.

Secondly, the television viewer can display videotext pages without the television receiver necessarily being switched on, that is, when operating only in a standby mode.

An improvement to this invention allows the television viewer to control television programs or video cassette recorders by using the names of programs displayed by teletext, rather than using numeric keys.

In general, the television viewer will find this invention easy to use for reading videotext pages and for controlling the programs on the viewer's television or video cassette recorder.

This invention can also be used to display information received by telephone. These data may be of the sound or "Minitel" type, and are processed in the same way as videotext data and therefore provide the same advantages as described above.

This invention concerns a process for displaying videotext data or data transmitted by telephone, and comprises the following steps: (1) reception and decoding of the data by a receiver/decoder device located in the television, or video cassette recorder, or connected to the television or video cassette recorder; (2) transmission of the decoded data to a television and/or VCR control device; and, (3) reception and display of the data on a display device on the control device. The invention may further comprise a supplementary encoding step of the data into a format optimizing the display of videotext data on a screen after the data have been received and decoded, and a step of modulating the signals before transmitting to the control device. Moreover, as further steps, all or some videotext data from one or several channels may stored in memory, for example in the control device, and displayed when required by the viewer.

Another improvement to the process according to the invention is that data may be displayed on a tactile screen and are processed by a microprocessor containing software capable of recognizing syntax or an associated code allowing the user to program a television set or a VCR by selecting a line by pressing on the appropriate area (generally a line) of the tactile screen.

This invention also concerns a system for the display of videotext data or data received through a telephone hand set or a Minitel, making use of the process according to the invention. Such a system comprises: a videotext signal receiver/decoder, a device for the transmission of these data to a control device containing a reception device for the transmitted data and a device for displaying these signals. This display device may be a tactile screen. In this case, the screen may be controlled by a microprocessor containing a syntax recognition function or identification codes of characters displayed on the display device in order to automatically select a program on the television set or the VCR simply by pressing on the area on the control panel screen corresponding to the characters identifying the required program.

DETAILED DESCRIPTION OF THE PREFERRED EMBODIMENTS

The following description is made primarily in the context of teletext data, for purposes of simplification, but it will be appreciated by those skilled in the art that the method and apparatus according to the invention can also be utilized with data received by telephone. The following description is also made primarily in the context of a television receiver. It is appreciated by those skilled in the art that the term television receiver refers to circuits or systems which can be operatively associated with, or form part of, a number of apparatus including, without limitation, television sets, video monitors, video cassette recorders, cable interfaces, satellite receivers, telephone network interfaces and the like. All apparatus which can be operated in association with television receivers are deemed to fall within the scope of this invention.

Figure 1:
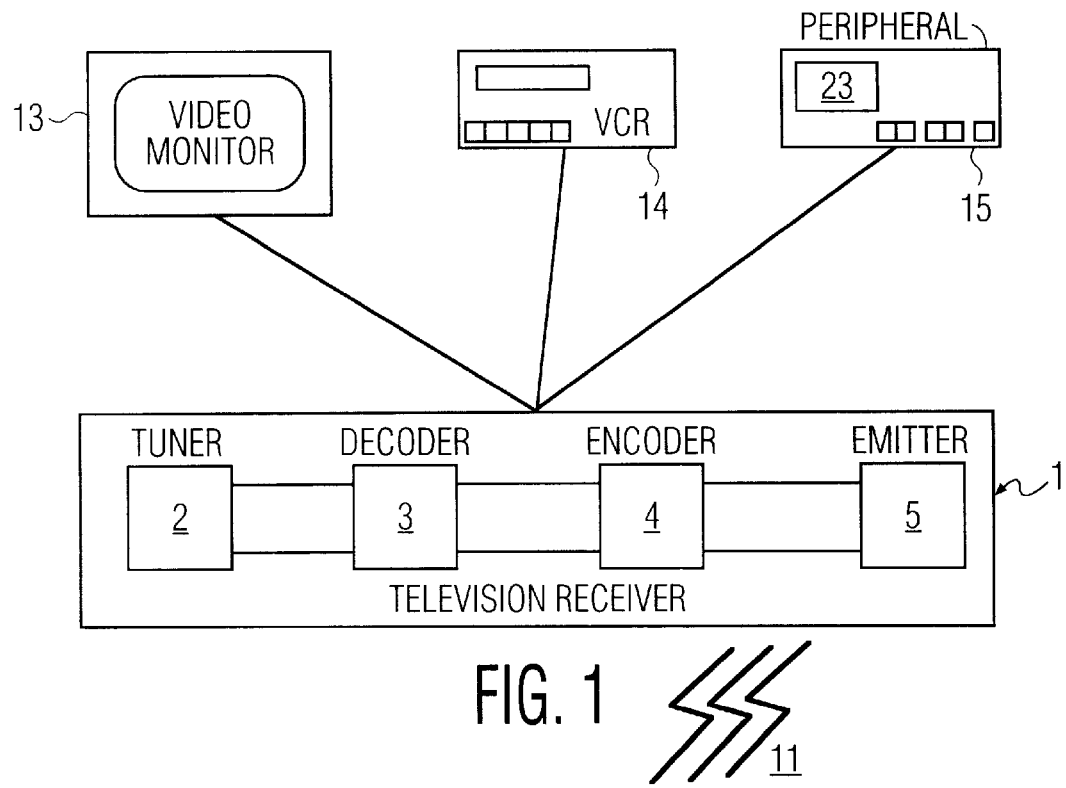
FIG. 1 shows a diagrammatic representation of a television receiver according to an inventive arrangement.

A television receiver 1 shown in FIG. 1 comprises: a tuner 2, a teletext decoder 3, a data encoder 4 and a data emitter 5. The television receiver 1 can be operatively associated with, or form a part of a plurality of different apparatus. An operative association with element 13 represents a television set or video monitor. An operative association with element 14 represents a video cassette recorder. An operative association with element 15 represents a number of different set top boxes or peripherals, such as a cable interface, a satellite receiver or a telephone network interface. The television receiver can be controlled by a remote control device.

Figure 2:
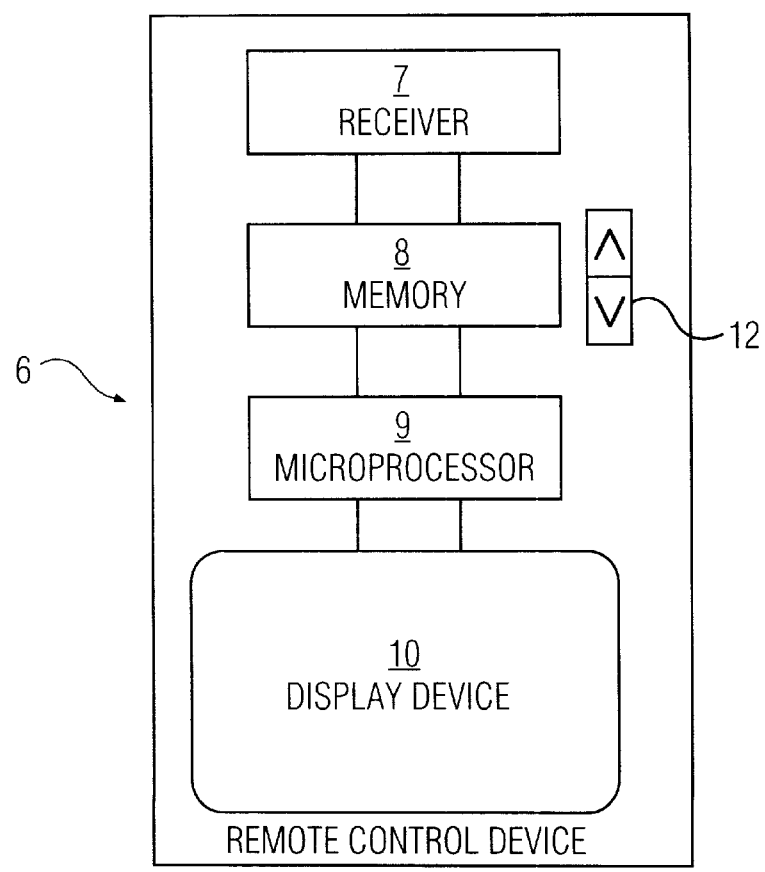
FIG. 2 shows a diagrammatic representation of a remote control device according to an inventive arrangement.

A remote control device 6 shown in FIG. 2 comprises: a receiver 7, comprising at least an antenna and a demodulator that demodulates signals, transmitted over a communications link 11, emitted by the emitter 5 of television 1. An example of this device is the Sharp GP1U58XY IR (infra red) receiver used in the ICC10 chassis. The controller 6 also includes a memory 8 in which formatted teletext data received by the receiver 7 are stored. A DRAM type memory, for example, can receive and transmit ASCII data. Whenever new teletext data are received, they are decoded by the teletext decoder 3, possibly encoded in the format considered by encoder 4, transmitted by emitter 5, received by receiver 7 and used to update the contents of memory 8. The various elements of the television receiver and control device in and of themselves, as described above and hereinafter, are known to those skilled in the art.

In the case of teletext, which is the type of videotext used in Europe, the tuner is preferably of the PIP ("Picture In Picture") type scanning the spectrum of channels in order to have a recurrent access to each videotext service in the various channels, and transmitting CVBS ("Color Video Burst Signal", international standard) type signals to the reception and decoding device possibly an ITT type TPU3040 or Siemens SDA5273 type device, for example adapted to the CEEFAX format.

Teletext data will be considered throughout the rest of this description, but the invention can also be applied for processing all types of videotext or data transmitted by telephone including alphanumeric data of the "Minitel" type or sound data. An appropriate modem will have to be used for signals received by telephone, for example such as the ITT LOTTI device that receives telephone data and outputs ASCII ("American Code for Information Interchange") data. This device may be connected to the television, built into it, or it may be in a modem-emitter box emitting directly to the remote control. It may also be built into the remote control, and the remote control can then act as a television and/or VCR control device. If the control device receives data through the telephone, the control device 6 may advantageously also be telephone, telephone hand set or a cordless telephone. In this case, the data transmitted from the television receiver is displayed on a display device of the telephone, telephone hand set or cordless telephone, and a viewer can selectively control the television receiver from a control device in the telephone, telephone hand set or cordless telephone in accordance with the displayed data. This aspect of the invention may be advantageously incorporated into a picture phone, which is already provided with a video display screen and the associated video display circuitry.

Advantageously, teletext data are then encoded by an encoder 4 into a specific digital data transmission format which, if we wish, can avoid using the CEEFAX format, in order to be modulated and emitted through an emitter 5. This emitter originates the communications link 11, and is presently preferred to be a radio wave (RF) emitter. Alternatively, an infra red (IR) emitter can be used, or the signals can be transmitted through the mains power supply. For example a device such as Thomson's RCT8000 "Black Quartz" or Mitsubishi's M34230 IR remote control could be used. This data communications link 11 may beneficially be made when the television is on "standby", in other words when the PIP tuner, the teletext decoder, the emitter and the micro-processor are switched on. This is an additional advantage of the invention, as will be described latter.

The teletext data storage memory may be located between the television encoder 4 and emitter 5, however it is presently preferred to put the memory in the control device 6 in order to limit the amount of data transmitted between the television and the control device and make it more comfortable to use.

The memory 8 can store all or some pages (for example about 20 pages corresponding to all the news) from one or several teletext services. It can also only load the few pages following and/or preceding the page selected by the user.

The control device comprises a microprocessor 9 associated with the memory 8 that controls a flat screen type display device 10. This microprocessor displays formatted data on screen 10. The format in which teletext data are encoded is chosen to optimize the display that must be at least alphanumeric. The displays may be, for example, 24 lines with 40 characters per line).

Moreover, the control device is equipped with a traditional power supply, a control signals emitter (usually IR) and control keys for controlling parameters for the television set and for the control panel screen displaying the teletext pages. The control panel screen may, for example, be a liquid crystal display screen or a plasma panel display screen.

This device according to the invention uses the following process: (1) teletext data are received and decoded by a receiver/decoder device located in the television or in a VCR, or connected to it; (2) possibly encoded in a given format adapted to the required display type; (3) modulated and emitted from the television to the control device; (4) received by the control device and stored in memory; and, (5) then displayed on a display device.

Thus the television viewer can see the picture on his television and teletext pages on its remote control at the same time. For example, a presently preferred method of displaying videotext pages is to display the page containing the summary of the service on one side of the screen, and the pages that the viewer can scroll on the other side. Another presently preferred display method is to display two pages of the same time allowing the viewer to scroll pages individually in the same way as one would browse through a book. To facilitate use in the latter display mode, page scrolling could be controlled by a scroll button, for example a rocker switch type control button 12, that causes the next or previous page or pages to be displayed when the viewer rocks the switch in one direction or the other.

Another advantage of this invention is that the user can display the television program and thus watch one program while looking at the program on other channels.

By using a simple microprocessor using an algorithm capable of recognizing characters displayed on the screen or an associated identification code, the process according to the invention can display a selection of programs on the control device screen including dates, times and program types. Such algorithms are known to those skilled in the art.

For example, one can display a list of programs on other channels, highlighting the line showing the program that is currently displayed on the television screen. One can also display the list of coming programs on the channel currently displayed or the television screen. Another advantage of the invention is that the software could choose a certain type of program, for example the "sports" theme containing sports news and coming programs dealing with sport. In this case, words or data corresponding to codes associated with each program are stored in memory for recognition by the software.

Other software could allow the viewer to use the remote control keyboard to pre select a program or a program type, that will then be selected on the television screen. The screen on the remote device displays programs corresponding to this program which are stored by means of teletext. Another improvement to this process may consist of recording viewer commands in memory, either when entered as inputs to the device or when selected by pressing on the tactile screen, and for example after a given recurrence, automatically displaying them on the control panel screen and/or on the television screen when the viewer switches on the television or video cassette recorder using the remote control. If the television and the remote control communicate by radio waves or, through the mains power supply, another advantage of this invention is that the user can look at his control panel and all information displayed on it although not in the same room as the television set, arid the television receiver may be in "standby" mode. The communications link 11 becomes bidirectional, with transmitters and receivers at both ends. The function of the remote control is then the same as a book containing teletext.

An aspect of this invention is the use of a tactile screen as display device 10 and software for processing displayed data. For example, using the preferred display mode described above and a tactile screen, the user can press on the part of the screen containing one of the titles in the summary page, in order to see the information corresponding to the selected title on the other page, by means of the microprocessor that displays the corresponding page by recognizing it from the page number displayed opposite the title. For example, the title concerned may be highlighted on the other page that is still displayed.

One skilled in the art frequently uses microprocessors with this type of character/syntax recognition function.

If an identification code ("show view" type) for a program is transmitted at the same time as the videotext signals, the viewer can automatically program a television receiver or VCR by pressing on the part of the screen on which the name and possibly the identification code of the selected program is displayed.

If no identification code is transmitted with the videotext, the microprocessor can build up an identification code using an appropriate algorithm by recognition of the time and date associated with the program and displayed in the same area as the program, in order to automatically program the television set or VCR.

Another application of the invention is using the tactile screen to select a program and to automatically display a list of programs currently on the other channels, in parallel.

As can be seen, due to this process according to the invention and its improvements, the remote control can become a genuine interactive book that the viewer can browse through, and can be a very easy way of controlling programs displayed on the television and programming the television and the VCR.

This invention is applicable to all types of television receivers capable of receiving at least one videotext service or telephone data, directly or through an independent remote control.

What is claimed is:

1. A system, comprising:

a television receiver having a signal receiver for receiving a signal comprising video information and program information, a video channel selection means, a remote control signal receiver, a remote control signal transmitter, and a control means, said control means separating said program information from said signal, encoding said program information and controlling said remote control signal transmitter to transmit said encoded program information, said television receiver coupled to a power source and capable of operating in one of a power ON state and a standby state; and a remote control device having a display device, a second remote control signal receiver, a second remote control signal transmitter, and a second control means, said second control means receiving said encoded program information, decoding said encoded program information and causing said display device to display said program information, wherein said television receiver is capable of transmitting said encoded program information while in any one of said power ON state and said standby state and said remote control device is capable of receiving, decoding and displaying said program information while said television receiver is in any one of said power ON state and said standby state.

2. The system according to claim 1, wherein said television receiver operates in association with at least one of a video display, a video cassette recorder, a cable interface, a satellite receiver and a telephone network interface.

3. The system according to claim 1, wherein in said standby state, no signal is displayed on said television receiver.

4. The system according to claim 1, wherein said program information comprises teletext pages.

5. The system according to claim 4, wherein said remote control device contains a syntax recognition means for recognizing program identification codes.

6. The system according to claim 5, wherein said syntax recognition means is capable of identifying at least one of the following items in a teletext page: program date; program time; or program type.

* * * * *